US006985594B1

(12) United States Patent
Vaudrey et al.

(10) Patent No.: US 6,985,594 B1
(45) Date of Patent: Jan. 10, 2006

(54) VOICE-TO-REMAINING AUDIO (VRA) INTERACTIVE HEARING AID AND AUXILIARY EQUIPMENT

(75) Inventors: Michael A. Vaudrey, Blacksburg, VA (US); William R. Saunders, Blacksburg, VA (US)

(73) Assignee: Hearing Enhancement Co., LLC., Roanoke, VA (US)

( * ) Notice: Subject to any disclaimer, the term of this patent is extended or adjusted under 35 U.S.C. 154(b) by 822 days.

(21) Appl. No.: 09/593,149

(22) Filed: Jun. 14, 2000

Related U.S. Application Data

(60) Provisional application No. 60/139,243, filed on Jun. 15, 1999.

(51) Int. Cl.
*H04R 3/00* (2006.01)
*H04R 5/02* (2006.01)
*H03G 3/00* (2006.01)

(52) U.S. Cl. .......................... 381/96; 381/18; 381/104; 381/307

(58) Field of Classification Search ................ 381/107, 381/96, 104, 307, 18; 704/225
See application file for complete search history.

(56) References Cited

U.S. PATENT DOCUMENTS

| | | | |
|---|---|---|---|
| 2,783,677 | A | 3/1957 | Becker |
| 3,046,337 | A | 7/1962 | Homyak |
| 3,110,769 | A | 11/1963 | Bertram |
| 4,024,344 | A | 5/1977 | Dolby et al. |
| 4,051,331 | A | 9/1977 | Strong et al. |
| 4,052,559 | A | 10/1977 | Paul et al. |
| 4,074,084 | A | 2/1978 | van den Berg |
| 4,150,253 | A | 4/1979 | Knoppel |
| 4,405,831 | A | 9/1983 | Michelson |
| 4,406,001 | A | 9/1983 | Klasco et al. |
| 4,454,609 | A | 6/1984 | Kates |
| 4,484,345 | A | 11/1984 | Stearns |
| 4,516,257 | A | 5/1985 | Torick |
| 4,622,440 | A | 11/1986 | Slavin |
| 4,776,016 | A | 10/1988 | Hansen |
| 4,809,337 | A | 2/1989 | Scholz et al. |
| 4,816,905 | A | 3/1989 | Tweedy et al. |
| 4,868,881 | A | 9/1989 | Zwicker et al. |
| 4,890,170 | A | 12/1989 | Inohana et al. |
| 4,941,179 | A | 7/1990 | Bergenstoff et al. |
| 5,003,605 | A | 3/1991 | Phillipps et al. |
| 5,033,036 | A | 7/1991 | Ohmori et al. |

(Continued)

FOREIGN PATENT DOCUMENTS

| | | |
|---|---|---|
| JP | 5342762 | 12/1993 |

(Continued)

OTHER PUBLICATIONS

ATSC Digital Television Stand, ATSC, Sep. 16, 1995, Annex B. www. atsc.org/Standards/A53/.*

(Continued)

*Primary Examiner*—Sinh Tran
*Assistant Examiner*—Devona Faulk
(74) *Attorney, Agent, or Firm*—Kenyon & Kenyon

(57) ABSTRACT

An integrated individual listening device and decoder for receiving an audio signal including a decoder for decoding the audio signal by separating the audio signal into a voice signal and a background signal, a first end-user adjustable amplifier coupled to the voice signal and amplifying the voice signal; a second end-user adjustable amplifier coupled to the background signal and amplifying the background signal; a summing amplifier coupled to outputs of said first and second end-user adjustable amplifiers and outputting a total audio signal, said total signal being coupled to an individual listening device.

2 Claims, 7 Drawing Sheets

U.S. PATENT DOCUMENTS

| | | | | |
|---|---|---|---|---|
| 5,131,311 | A | 7/1992 | Murakami et al. | |
| 5,138,498 | A | 8/1992 | Takigami | |
| 5,144,454 | A | 9/1992 | Cury | |
| 5,146,504 | A | 9/1992 | Pinckley | |
| 5,155,510 | A | 10/1992 | Beard | |
| 5,155,770 | A | 10/1992 | Maejima | |
| 5,197,100 | A | 3/1993 | Shiraki | |
| 5,210,366 | A | 5/1993 | Sykes, Jr. | |
| 5,212,764 | A | 5/1993 | Ariyoshi | |
| 5,216,718 | A | 6/1993 | Fukuda | |
| 5,228,088 | A | 7/1993 | Kane et al. | |
| 5,294,746 | A | 3/1994 | Tsumura et al. | |
| 5,297,209 | A | 3/1994 | Kowaki | |
| 5,319,713 | A | 6/1994 | Waller, Jr. et al. | |
| 5,323,467 | A | 6/1994 | Hermes | |
| 5,341,253 | A | 8/1994 | Liao et al. | |
| 5,384,599 | A | 1/1995 | Casavant et al. | |
| 5,395,123 | A | 3/1995 | Kondo | |
| 5,396,560 | A | 3/1995 | Arcos et al. | |
| 5,400,409 | A | 3/1995 | Linhard | |
| 5,408,686 | A | 4/1995 | Mankovitz | |
| 5,434,922 | A | 7/1995 | Miller et al. | |
| 5,450,146 | A | 9/1995 | Chedeville et al. | |
| 5,466,883 | A * | 11/1995 | Miyashita et al. | 434/307 A |
| 5,469,370 | A | 11/1995 | Ostrover et al. | |
| 5,485,522 | A | 1/1996 | Solve et al. | |
| 5,530,760 | A | 6/1996 | Paisley | |
| 5,541,999 | A | 7/1996 | Hirai | |
| 5,564,001 | A | 10/1996 | Lewis | |
| 5,569,038 | A * | 10/1996 | Tubman et al. | 434/308 |
| 5,569,869 | A | 10/1996 | Sone | |
| 5,572,591 | A | 11/1996 | Numazu et al. | |
| 5,576,843 | A | 11/1996 | Cookson et al. | |
| 5,619,383 | A | 4/1997 | Ngai | |
| 5,621,182 | A | 4/1997 | Matsumoto | |
| 5,621,850 | A | 4/1997 | Kane et al. | |
| 5,631,712 | A | 5/1997 | Suh et al. | |
| 5,644,677 | A | 7/1997 | Park et al. | |
| 5,666,350 | A | 9/1997 | Huang et al. | |
| 5,668,339 | A | 9/1997 | Shin | |
| 5,671,320 | A | 9/1997 | Cookson et al. | |
| 5,684,714 | A | 11/1997 | Yogeshwar et al. | |
| 5,698,804 | A | 12/1997 | Mizuno | |
| 5,703,308 | A | 12/1997 | Tashiro et al. | |
| 5,706,145 | A | 1/1998 | Hindman et al. | |
| 5,712,950 | A | 1/1998 | Cookson et al. | |
| 5,717,763 | A | 2/1998 | Choi et al. | |
| 5,732,390 | A | 3/1998 | Katayanagi et al. | |
| 5,751,903 | A | 5/1998 | Swaminathan et al. | |
| 5,794,187 | A * | 8/1998 | Franklin et al. | 704/225 |
| 5,808,569 | A | 9/1998 | Wuppermann et al. | |
| 5,812,688 | A | 9/1998 | Gibson | |
| 5,820,384 | A | 10/1998 | Tubman et al. | |
| 5,822,370 | A | 10/1998 | Graupe | |
| 5,852,800 | A | 12/1998 | Modeste et al. | |
| 5,872,851 | A | 2/1999 | Petroff | |
| 5,910,996 | A * | 6/1999 | Eggers et al. | 381/107 |
| 5,991,313 | A | 11/1999 | Tanaka et al. | |
| 6,507,672 | B1 * | 1/2003 | Watkins et al. | 382/232 |

FOREIGN PATENT DOCUMENTS

| | | | |
|---|---|---|---|
| WO | WO 97/37449 | | 10/1997 |
| WO | WO9908380 | * | 2/1999 |

OTHER PUBLICATIONS

Digital Audio Compression Standard (AC-3), ATSC, Annex C AC-3 Karaoke Mode pp. 127-130).*

ATSC Digital Television Standard, ATSC, Sep. 16, 1995, Annex B. Available on-line at www.atsc.org/Standards/A53/.

Guide to the Use of ATSC Digital Television Standard, ATSC, Oct. 4, 1995, pp. 54-59. Available on-line at www.atsc.org/Standards/A54/.

Digital Audio Compression Standard (AC-3), ATSC, Annex C AC-3 Karaoke Mode pp. 127-133, Available on-line at www.atsc.org/Standards/A52/.

Shure Incorporated homepage, available on-line at www.shure.com. The Examiner is encouraged to review the entire website for any relevant subject matter.

Digidesign's web page listing of their Aphex Aural Exciter. Available on-line at www.digidesign.com/products/all_prods.php3?location=main&product_id=8. The Examiner is encouraged to review the entire website for any relevant subject matter.

Chen Yingying "Transitional Product for Digital TV—Development of Set-Top-Box" Mar. 1999.

* cited by examiner

VOICE-TO-REMAINING AUDIO (VRA) INTERACTIVE HEARING AID AND AUXILIARY EQUIPMENT

CROSS REFERENCE TO RELATED APPLICATIONS

The present application claims the benefit of U.S. provisional patent application Ser. No. 60/139,243 entitled "Voice-to-Remaining Audio (VRA) Interactive Hearing Aid & Auxiliary Equipment," filed on Jun. 15, 1999.

FIELD OF THE INVENTION

Embodiments of the present invention relate generally to processing audio signals, and more particularly, to a method and apparatus for processing audio signals such that hearing impaired listeners can adjust the level of voice-to-remaining audio (VRA) to improve their listening experience.

BACKGROUND OF THE INVENTION

As one ages and progresses through life, over time due to many factors, such as age, genetics, disease, and environmental effects, one's hearing becomes compromised. Usually, the deterioration is specific to certain frequency ranges.

In addition to permanent hearing impairments, one may experience temporary hearing impairments due to exposure to particular high sound levels. For example, after target shooting or attending a rock concert one may have temporary hearing impairments that improve somewhat, but over time may accumulate to a permanent hearing impairment. Even lower sound levels than these but longer lasting may have temporary impacts on one's hearing, such as working in a factory or teaching in a elementary school.

Typically, one compensates for hearing loss or impairment by increasing the volume of the audio. But, this simply increases the volume of all audible frequencies in the total signal. The resulting increase in total signal volume will provide little or no improvement in speech intelligibility, particularly for those whose hearing impairment is frequency dependent.

While hearing impairment increases generally with age, many hearing impaired individuals refuse to admit that they are hard of hearing, and therefore avoid the use of devices that may improve the quality of their hearing. While many elderly people begin wearing glasses as they age, a significantly smaller number of these individuals wear hearing aids, despite the significant advances in the reduction of the size of hearing aids. This phenomenon is indicative of the apparent societal stigma associated with hearing aids and/or hearing impairments. Consequently, it is desirable to provide a technique for improving the listening experience of a hearing impaired listener in a way that avoids the apparent associated societal stigma.

Most audio programming, be it television audio, movie audio, or music can be divided into two distinct components: the foreground and the background. In general, the foreground sounds are the ones intended to capture the audiences attention and retain their focus, whereas the background sounds are supporting, but not of primary interest to the audience. One example of this can be seen in television programming for a "sitcom," in which the main character's voices deliver and develop the plot of the story while sound effects, audience laughter, and music fill the gaps.

Currently, the listening audience for all types of audio media are restricted to the mixture decided upon by the audio engineer during production. The audio engineer will mix all other background noise components with the foreground sounds at levels that the audio engineer prefers, or at which the audio engineer understands have some historical basis. This mixture is then sent to the end-user as either a single (mono) signal or in some cases as a stereo (left and right) signal, without any means for adjusting the foreground to the background.

The lack of this ability to adjust foreground relative to background sounds is particularly difficult for the hearing impaired. In many cases, programming is difficult to understand (at best) due to background audio masking the foreground signals.

There are many new digital audio formats available. Some of these have attempted to provide capability for the hearing impaired. For example, Dolby Digital, also referred to as AC-3 (or Audio Codec version 3), is a compression technique for digital audio that packs more data into a smaller space. The future of digital audio is in spatial positioning, which is accomplished by providing 5.1 separate audio channels: Center, Left and Right, and Left and Right Surround. The sixth channel, referred to as the 0.1 channel refers to a limited bandwidth low frequency effects (LFE) channel that is mostly non-directional due to its low frequencies. Since there are 5.1 audio channels to transmit, compression is necessary to ensure that both video and audio stay within certain bandwidth constraints. These constraints (imposed by the Federal Communications Commission (FCC)) are more strict for terrestrial transmission than for digital video disk (DVD)s, currently. There is more than enough space on a DVD to provide the end-user with uncompressed audio (much more desirable from a listening standpoint). Video data is compressed most commonly through MPEG (moving pictures experts group) developed techniques, although they also have an audio compression technique very similar to Dolby's.

The DVD industry has adopted Dolby Digital (DD) as its compression technique of choice. Most DVD's are produced using DD. The ATSC (Advanced Television Standards Committee) has also chosen AC-3 as its audio compression scheme for American digital TV. This has spread to many other countries around the world. This means that production studios (movie and television) must encode their audio in DD for broadcast or recording.

There are many features, in addition to the strict encoding and decoding scheme, that are frequently discussed in conjunction with Dolby Digital. Some of these features are part of DD and some are not. Along with the compressed bitstream, DD sends information about the bitstream called metadata, or "data about the data." It is basically zero's and ones indicating the existence of options available to the end-user. Three of these options are dialnorm (dialog normalization), dynrng (dynamic range), and bsmod (bit stream mode that controls the main and associated audio services). The first two are an integral part of DD already, since many decoders handle these variables, giving end-users the ability to adjust them. The third bit of information, bsmod, is described in detail in ATSC document A/54 (not a Dolby publication) but also exists as part of the DD bitstream. The value of bsmod alerts the decoder about the nature of the incoming audio service, including the presence of any associated audio service. At this time, no known manufacturers are utilizing this parameter. Multiple language DVD performances are currently provided via multiple complete main audio programs on one of the eight available audio tracks on the DVD.

The dialnorm parameter is designed to allow the listener to normalize all audio programs relative to a constant voice level. Between channels and between program and commercial, overall audio levels fluctuate wildly. In the future, producers will be asked to insert the dialnorm parameter which indicates the sound pressure level (SPL)s at which the dialog has been recorded. If this value is set as 80 dB for a program but 90 dB for a commercial, the television will decode that information examine the level the end-user has entered as desirable (say 85 dB) and will adjust the movie up 5 dB and the commercial down 5 dB. This is a total volume level adjustment that is based on what the producer enters as the dialnorm bit value.

A section from the AC-3 description (from document A/52) provides the best description of this technology. "The dynrng values typically indicate gain reduction during the loudest signal passages, and gain increase during the quiet passages. For the listener, it is desirable to bring the loudest sounds down in level towards the dialog level, and the quiet sounds up in level, again towards dialog level. Sounds which are at the same loudness as the normal spoken dialogue will typically not have their gain changed."

The dynrng variable provides the end-user with an adjustable parameter that will control the amount of compression occurring on the total volume with respect to the dialog level. This essentially limits the dynamic range of the total audio program about the mean dialog level. This does not, however, provide any way to adjust the dialog level independently of the remaining audio level.

One attempt to improve the listening experience of hearing impaired listeners is provided for in The ATSC, Digital Television Standard (Annex B). Section 6 of Annex B of the ATSC standard describes the main audio services and the associated audio services. An AC-3 elementary stream contains the encoded representation of a single audio service. Multiple audio services are provided by multiple elementary streams. Each elementary stream is conveyed by the transport multiplex with a unique PID. There are a number of audio service types which may be individually coded into each elementary stream. One of the audio service types is called the complete main audio service (CM). The CM type of main audio service contains a complete audio program (complete with dialogue, music and effects). The CM service may contain from 1 to 5.1 audio channels. The CM service may be further enhanced by means of the other services. Another audio service type is the hearing impaired service (HI). The HI associated service typically contains only dialogue which is intended to be reproduced simultaneously with the CM service. In this case, the HI service is a single audio channel. As stated therein, this dialogue may be processed for improved intelligibility by hearing impaired listeners. Simultaneous reproduction of both the CM and HI services allows the hearing impaired listener to hear a mix of the CM and HI services in order to emphasize the dialogue while still providing some music and effects. Besides providing the HI service as a single dialogue channel, the HI service may be provided as a complete program mix containing music, effects, and dialogue with enhanced intelligibility. In this case, the service may be coded using any number of channels (up to 5.1). While this service may improve the listening experience for some hearing impaired individuals, it certainly will not for those who do not employ the proscribed receiver for fear of being stigmatized as hearing impaired. Finally, any processing of the dialogue for hearing impaired individuals prevents the use of this channel in creating an audio program for non-hearing individuals. Moreover, the relationship between the HI service and the CM service set forth in Annex B remains undefined with respect to the relative signal levels of each used to create a channel for the hearing impaired.

Other techniques have been employed to attempt to improve the intelligibility of audio. For example, U.S. Pat. No. 4,024,344 discloses a method of creating a "center channel" for dialogue in cinema sound. This technique disclosed therein correlates left and right stereophonic channels and adjusts the gain on either the combined and/or the separate left or right channel depending on the degree of correlation between the left and right channel. The assumption being that the strong correlation between the left and right channels indicates the presence of dialogue. The center channel, which is the filtered summation of the left and right channels, is amplified or attenuated depending on the degree of correlation between the left and right channels. The problem with this approach is that it does not discriminate between meaningful dialogue and simple correlated sound, nor does it address unwanted voice information within the voice band. Therefore, it cannot improve the intelligibility of all audio for all hearing impaired individuals.

In general, the previously cited inventions of Dolby and others have all attempted to modify some content of the audio signal through various signal processing hardware or algorithms, but those methods do not satisfy the individual needs or preferences of different listeners. In sum, all of these techniques provide a less than optimum listening experience for hearing impaired individuals as well as non-hearing impaired individuals.

Finally, miniaturized electronics and high quality digital audio has brought about a revolution in the digital hearing aid technology. In addition, the latest standards of digital audio transmission and recordings including DVD (in all formats), digital television, Internet radio, and digit radio, are incorporating sophisticated compression methods that allow an end-user unprecedented control over audio programming. The combination of these two technologies has presented improved methods for providing hearing impaired end-users with the ability to enjoy digital audio programming. This combination, however, fails to address all of the needs and concerns of different hearing impaired end-users.

The present invention is therefore directed to the problem of developing a system and method for processing audio signals that optimizes the listening experience for hearing impaired listeners, as well as non-hearing impaired listeners, individually or collectively.

SUMMARY OF THE INVENTION

An integrated individual listening device and decoder for receiving an audio signal including a decoder for decoding the audio signal by separating the audio signal into a voice signal and a background signal, a first end-user adjustable amplifier coupled to the voice signal and amplifying the voice signal, a second end-user adjustable amplifier coupled to the background signal and amplifying the background signal, a summing amplifier coupled to outputs of said first and second end-user adjustable amplifiers and outputting a total audio signal, said total signal being coupled to an individual listening device.

DETAILED DESCRIPTION

Figure 1:
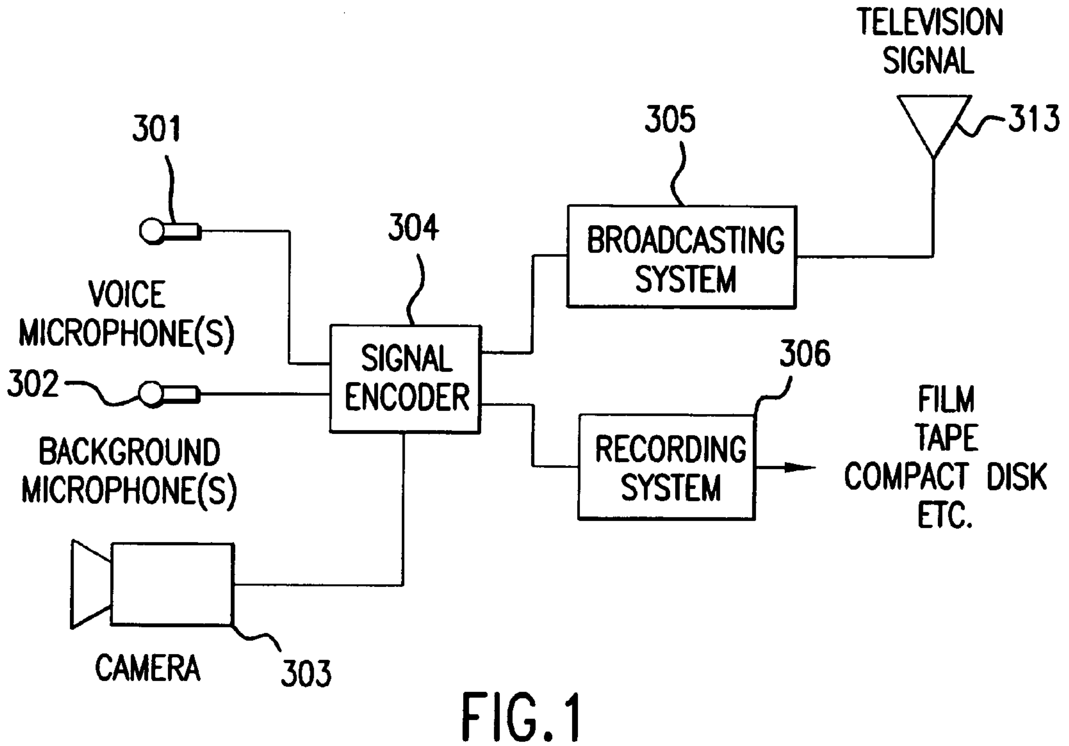
FIG. 1 illustrates a general approach according to the present invention for separating relevant voice information from general background audio in a recorded or broadcast program.

Embodiments of the present invention are directed to an integrated individual listening device and decoder. An example of one such decoder is a Dolby Digital (DD) decoder. As stated above, Dolby Digital is an audio compression standard that has gained popularity for use in terrestrial broadcast and recording media. Although the discussion herein uses a DD decoder, other types of decoders may be used without departing from the spirit and scope of the present invention. Moreover, other digital audio standards besides Dolby Digital are not precluded. This embodiment allows a hearing impaired end-user in a listening environment with other listeners, to take advantage of the "Hearing Impaired Associated Audio Service" provided by DD without affecting the listening enjoyment of the other listeners. As used herein, the term "end-user" refers to a consumer, listener or listeners of a broadcast or sound recording or a person or persons receiving an audio signal on an audio media that is distributed by recording or broadcast. In addition, the term "individual listening device" refers to hearing aids, headsets, assistive listening devices, cochlear implants or other devices that assist the end-user's listening ability. Further, the term "preferred audio" refers to the preferred signal, voice component, voice information, or primary voice component of an audio signal and the term "remaining audio" refers to the background, musical or non-voice component of an audio signal.

Other embodiments of the present invention relate to a decoder that sends wireless transmissions directly to a individual listening device such as a hearing aid or cochlear implant. Used in conjunction with the "Hearing Impaired Associated Audio Service" provided by DD which provides separate dialog along with a main program, the decoder provides the hearing impaired end-user with adjustment capability for improve intelligibility with other listeners in the same listening environment while the other listeners enjoy the unaffected main program.

Further embodiments of the present invention relate to an interception box which services the communications market when broadcast companies transition from analog transmission to digital transmission. The intercept box allows the end-user to take advantage of the hearing impaired mode (HI) without having a fully functional main/associated audio service decoder. The intercept box decodes transmitted digital information and allows the end-user to adjust hearing impaired parameters with analog style controls This analog signal is also fed directly to an analog play device such as a television. According to the present invention, the intercept box can be used with individual listening devices such as hearing aids or it can allow digital services to be made available to the analog end-user during the transition period.

Significance of Ratio of Preferred Audio to Remaining Audio

The present invention begins with the realization that the listening preferential range of a ratio of a preferred audio signal relative to any remaining audio is rather large, and certainly larger than ever expected. This significant discovery is the result of a test of a small sample of the population regarding their preferences of the ratio of the preferred audio signal level to a signal level of all remaining audio.

Specific Adjustment of Desired Range for Hearing Impaired or Normal Listeners Very directed research has been conducted in the area of understanding how normal and hearing impaired end-users perceive the ratio between dialog and remaining audio for different types of audio programming. It has been found that the population varies widely in the range of adjustment desired between voice and remaining audio.

Two experiments have been conducted on a random sample of the population including elementary school children, middle school children, middle-aged citizens and senior citizens. A total of 71 people were tested. The test consisted of asking the end-user to adjust the level of voice and the level of remaining audio for a football game (where the remaining audio was the crowd noise) and a popular song (where the remaining audio was the music). A metric called the VRA (voice to remaining audio) ratio was formed by dividing the linear value of the volume of the dialog or voice by the linear value of the volume of the remaining audio for each selection.

Several things were made clear as a result of this testing. First, no two people prefer the identical ratio for voice and remaining audio for both the sports and music media. This is very important since the population has relied upon producers to provide a VRA (which cannot be adjusted by the consumer) that will appeal to everyone. This can clearly not occur, given the results of these tests. Second, while the VRA is typically higher for those with hearing impairments (to improve intelligibility) those people with normal hearing also prefer different ratios than are currently provided by the producers.

It is also important to highlight the fact that any device that provides adjustment of the VRA must provide at least as much adjustment capability as is inferred from these tests in order for it to satisfy a significant segment of the population. Since the video and home theater medium supplies a variety of programming, we should consider that the ratio should extend from at least the lowest measured ratio for any media (music or sports) to the highest ratio from music or sports. This would be 0.1 to 20.17, or a range in decibels of 46 dB. It should also be noted that this is merely a sampling of the population and that the adjustment capability should theoretically be infinite since it is very likely that one person may prefer no crowd noise when viewing a sports broadcast and that another person would prefer no announcement. Note that this type of study and the specific desire for widely varying VRA ratios has not been reported or discussed in the literature or prior art.

In this test, an older group of men was selected and asked to do an adjustment (which test was later performed on a group of students) between a fixed background noise and the voice of an announcer, in which only the latter could be varied and the former was set at 6.00. The results with the older group were as follows:

TABLE I

| Individual | Setting |
|---|---|
| 1 | 7.50 |
| 2 | 4.50 |
| 3 | 4.00 |
| 4 | 7.50 |
| 5 | 3.00 |
| 6 | 7.00 |
| 7 | 6.50 |
| 8 | 7.75 |
| 9 | 5.50 |
| 10 | 7.00 |
| 11 | 5.00 |

To further illustrate the fact that people of all ages have different hearing needs and preferences, a group of 21 college students was selected to listen to a mixture of voice and background and to select, by making one adjustment to the voice level, the ratio of the voice to the background. The background noise, in this case crowd noise at a football game, was fixed at a setting of six (6.00) and the students were allowed to adjust the volume of the announcers' play by play voice which had been recorded separately and was pure voice or mostly pure voice. In other words, the students were selected to do the same test the group of older men did. Students were selected so as to minimize hearing infirmities caused by age. The students were all in their late teens or early twenties. The results were as follows:

TABLE II

| Student | Setting of Voice |
|---|---|
| 1 | 4.75 |
| 2 | 3.75 |
| 3 | 4.25 |
| 4 | 4.50 |
| 5 | 5.20 |
| 6 | 5.75 |
| 7 | 4.25 |
| 8 | 6.70 |
| 9 | 3.25 |
| 10 | 6.00 |
| 11 | 5.00 |
| 12 | 5.25 |
| 13 | 3.00 |
| 14 | 4.25 |
| 15 | 3.25 |
| 16 | 3.00 |
| 17 | 6.00 |
| 18 | 2.00 |
| 19 | 4.00 |
| 20 | 5.50 |
| 21 | 6.00 |

The ages of the older group (as seen in Table I) ranged from 36 to 59 with the preponderance of the individuals being in the 40 or 50 year old group. As is indicated by the test results, the average setting tended to be reasonably high indicating some loss of hearing across the board. The range again varied from 3.00 to 7.75, a spread of 4.75 which confirmed the findings of the range of variance in people's preferred listening ratio of voice to background or any preferred signal to remaining audio (PSRA). The overall span for the volume setting for both groups of subjects ranged from 2.0 to 7.75. These levels represent the actual values on the volume adjustment mechanism used to perform this experiment. They provide an indication of the range of signal to noise values (when compared to the "noise" level 6.0) that may be desirable from different end-users.

To gain a better understanding of how this relates to relative loudness variations chosen by different end-users, consider that the non-linear volumen control variation from 2.0 to 7.75 represents an increase of 20 dB or ten (10) times. Thus, for even this small sampling of the population and single type of audio programming it was found that different listeners do prefer quite drastically different levels of "preferred signal" with respect to "remaining audio." This preference cuts across age groups showing that it is consistent with individual preference and basic hearing abilities, which was heretofore totally unexpected.

As the test results show, the range that students (as seen in Table II) without hearing infirmities caused by age selected varied considerably from a low setting of 2.00 to a high of 6.70, a spread of 4.70 or almost one half of the total range of from 1 to 10. The test is illustrative of how the "one size fits all" mentality of most recorded and broadcast audio signals falls far short of giving the individual listener the ability to adjust the mix to suit his or her own preferences and hearing needs. Again, the students had a wide spread in their settings as did the older group demonstrating the individual differences in preferences and hearing needs. One result of this test is that hearing preferences is widely disparate.

Further testing has confirmed this result over a larger sample group. Moreover, the results vary depending upon the type of audio. For example, when the audio source was music, the ratio of voice to remaining audio varied from approximately zero to about 10, whereas when the audio source was sports programming, the same ratio varied between approximately zero and about 20. In addition, the standard deviation increased by a factor of almost three, while the mean increased by more than twice that of music.

The end result of the above testing is that if one selects a preferred audio to remaining audio ratio and fixes that forever, one has most likely created an audio program that is less than desirable for a significant fraction of the population. And, as stated above, the optimum ratio may be both a short-term and long-term time varying function. Consequently, complete control over this preferred audio to remaining audio ratio is desirable to satisfy the listening needs of "normal" or non-hearing impaired listeners. Moreover, providing the end-user with the ultimate control over this ratio allows the end-user to optimize his or her listening experience.

The end-user's independent adjustment of the preferred audio signal and the remaining audio signal will be the apparent manifestation of one aspect of the present invention. To illustrate the details of the present invention, consider the application where the preferred audio signal is the relevant voice information.

Creation of the Preferred Audio Signal and the Remaining Audio Signal

FIG. 1 illustrates a general approach to separating relevant voice information from general background audio in a recorded or broadcast program. There will first need to be a determination made by the programming director as to the definition of relevant voice. An actor, group of actors, or commentators must be identified as the relevant speakers.

Once the relevant speakers are identified, their voices will be picked up by the voice microphone 301. The voice microphone 1 will need to be either a close talking microphone (in the case of commentators) or a highly directional shot gun microphone used in sound recording. In addition to being highly directional, these microphones 301 will need to be voice-band limited, preferably from 200–5000 Hz. The combination of directionality and band pass filtering minimize the background noise acoustically coupled to the relevant voice information upon recording. In the case of certain types of programming, the need to prevent acoustic coupling can be avoided by recording relevant voice of dialogue off-line and dubbing the dialogue where appropriate with the video portion of the program. The background microphones 302 should be fairly broadband to provide the full audio quality of background information, such as music.

A camera 303 will be used to provide the video portion of the program. The audio signals (voice and relevant voice) will be encoded with the video signal at the encoder 304. In general, the audio signal is usually separated from the video signal by simply modulating it with a different carrier frequency. Since most broadcasts are now in stereo, one way to encode the relevant voice information with the background is to multiplex the relevant voice information on the separate stereo channels in much the same way left front and right front channels are added to two channel stereo to produce a quadraphonic disc recording. Although this would create the need for additional broadcast bandwidth, for recorded media this would not present a problem, as long as the audio circuitry in the video disc or tape player is designed to demodulate the relevant voice information.

Once the signals are encoded, by whatever means deemed appropriate, the encoded signals are sent out for broadcast by broadcast system 305 over antenna 313, or recorded on to tape or disc by recording system 306. In case of recorded audio video information, the background and voice information could be simply placed on separate recording tracks.

Receiving and Demodulating the Preferred Audio Signal and the Remaining Audio

Figure 2:
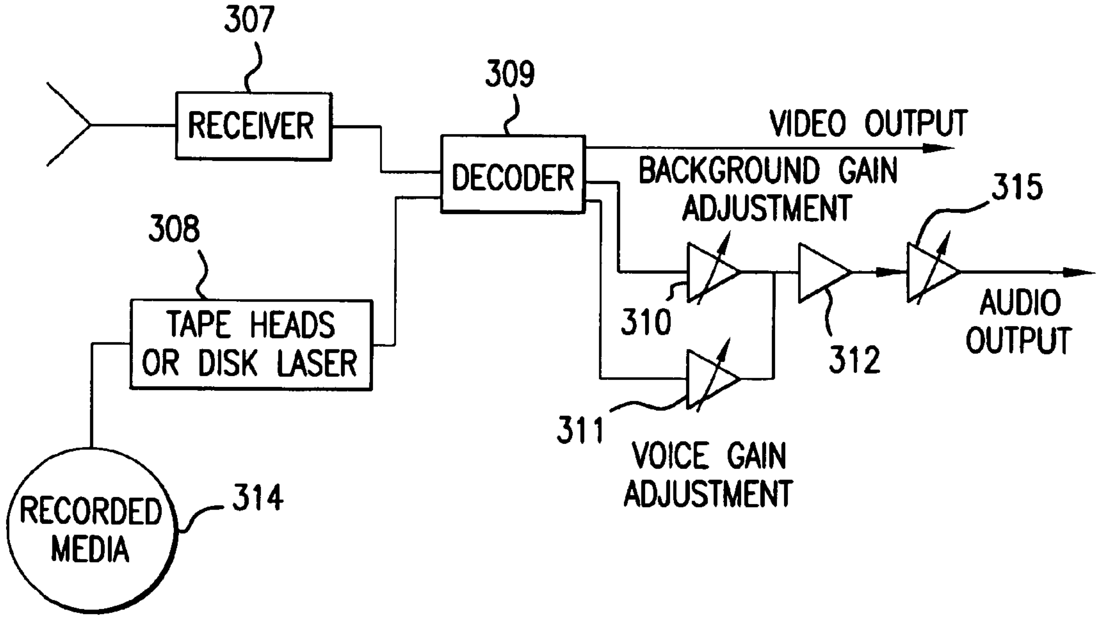
FIG. 2 illustrates and exemplary embodiment according to the present invention for receiving and playing back the encoded program signals.

FIG. 2 illustrates an exemplary embodiment for receiving and playing back the encoded program signals. A receiver system 307 demodulates the main carrier frequency from the encoded audio/video signals, in the case of broadcast information. In the case of recorded media 314, the heads from a VCR or the laser reader from a CD player 308 would produce the encoded audio/video signals.

In either case, these signals would be sent to a decoding system 309. The decoder 309 would separate the signals into video, voice audio, and background audio using standard decoding techniques such as envelope detection in combination with frequency or time division demodulation. The background audio signal is sent to a separate variable gain amplifier 310, that the listener can adjust to his or her preference. The voice signal is sent to a variable gain amplifier 311, that can be adjusted by the listener to his or her particular needs, as discussed above.

The two adjusted signals are summed by a unity gain summing amplifier 132 to produce the final audio output. Alternatively, the two adjusted signals are summed by unity gain summing amplifier 312 and further adjusted by variable gain amplifier 315 to produce the final audio output. In this manner the listener can adjust relevant voice to background levels to optimize the audio program to his or her unique listening requirements at the time of playing the audio program. As each time the same listener plays the same audio, the ratio setting may need to change due to changes in the listener's hearing, the setting remains infinitely adjustable to accommodate this flexibility.

Configuration of a Typical Individual Listening Device

Figure 3:
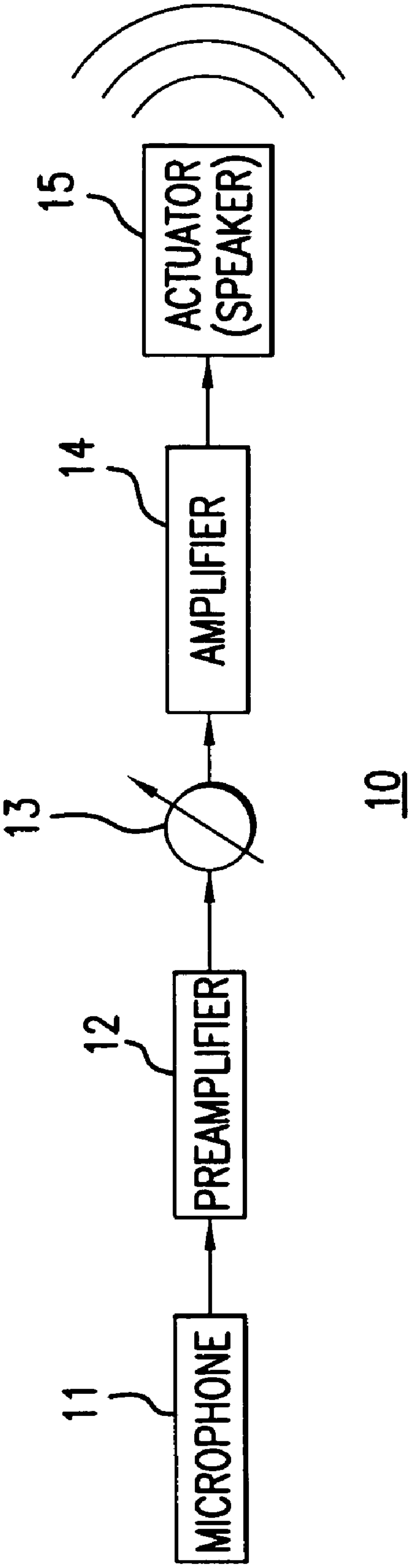
FIG. 3 illustrates and exemplary embodiment of a conventional individual listening device such as a hearing aid.

FIG. 3 illustrates an exemplary embodiment of a convention individual listening device such as a hearing aid 10. Hearing aid 10 includes a microphone 11, a preamplifier 12, a variable amplifier 13, a power amplifier 14 and an actuator 15. Microphone 11 is typically positioned in hearing aid 10 such that it faces outward to detect ambient environmental sounds in close proximity to the end-user's ear. Microphone 11 receives the ambient environmental sounds as an acoustic pressure and coverts the acoustic pressure into an electrical signal. Microphone 11 is coupled to preamplifier 12 which receives the electrical signal. The electrical signal is processed by preamplifier 12 and produces a higher amplitude electrical signal. This higher amplitude electrical signal is forwarded to an end-user controlled variable amplifier. End-user controlled variable amplifier is connected to a dial on the outside of the hearing aid. Thus, the end-user has the ability to control the volume of the microphone signal (which is the total of all ambient sound). The output of the end-user controlled variable amplifier 13 is sent to power amplifier 14 where the electrical signal is provided with power in order to driver actuator/speaker 15. Actuator/speaker 15 is positioned inside the ear canal of the end-user. Actuator/speaker 15 converts the electrical signal output from power amplifier 14 into an acoustic signal that is an amplified version of the microphone signal representing the ambient noise. Acoustic feedback from the actuator to the microphone 11 is avoided by placing the actuator/speaker 15 inside the ear canal and the microphone 11 outside the ear canal.

Although the components of a hearing aid have been illustrated above, other individual listening devices as discussed above, can be used with the present invention.

Individual Listening Device and Decoder

In a room listening environment, there may be a combination of listeners with varying degrees of hearing impairments as well as listeners with normal listening. A hearing aid or other listening device as described above, can be equipped with a decoder that receives a digital signal from a programming source and separately decodes the signal, providing the end-user access to the voice, for example, the hearing impaired associated service, without affecting the listening environment of other listeners.

Figure 4:
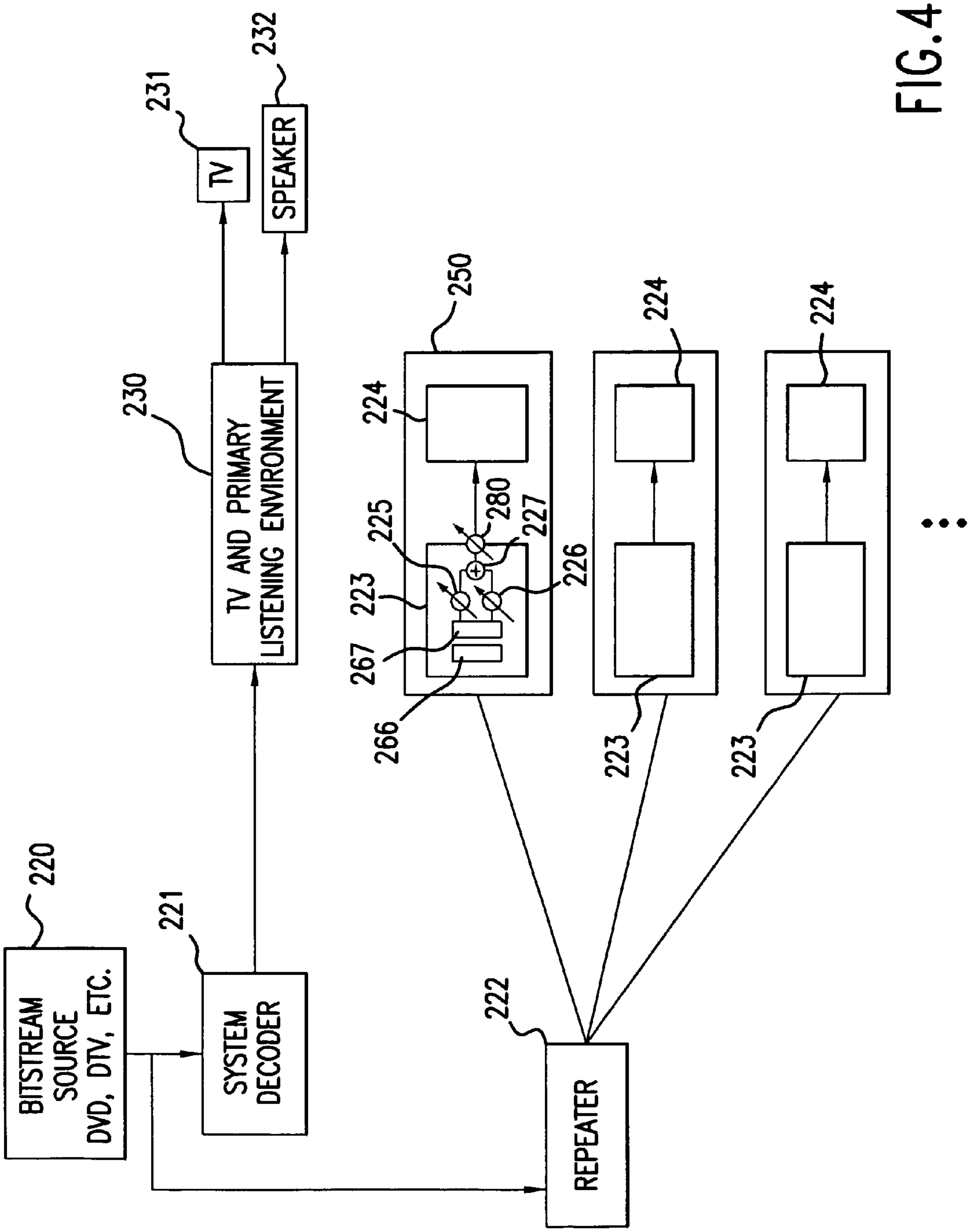
FIG. 4 is a block diagram illustrating a voice-to-remaining audio (VRA) system for simultaneous multiple end-users.

As stated above, preferred ratio of voice to remaining audio differs significantly for different people, especially hearing impaired people, and differs for different types of programming (sports versus music, etc.). FIG. 4 is a block diagram illustrating a VRA system for simultaneous multiple end-users according to an embodiment of the present invention. The system includes a bitstream source 220, a system decoder 221, a repeater 222 and a plurality of personal VRA decoders 223 that are integrated with or connected to individual listening devices 224. Typically, a digital source (DVD, digital television broadcast, etc.) provides a digital information signal containing compressed digital and video information. For example, Dolby Digital provides a digital information signal having an audio program such as the music and effect (ME) signal and a hearing impaired (HI) signal which is part of the Dolby Digital associated services. According to one embodiment of the present invention, digital information signal includes a separate voice component signal (e.g., HI signal) and remaining audio component signal (e.g., ME or CE signal) simultaneously transmitted as a single bitstream to system decoder 221.

According to one embodiment of the present invention, the bitstream from bitstream source 220 is also supplied to repeater 222. Repeater 222 retransmits the bitstream to a plurality of personal VRA decoders 223. Each personal VRA decoder 223 includes a demodulator 266 and a decoder 267 for decoding the bitstream and variable amplifiers 225 and 226 for adjusting the voice component signal and the remaining audio signal component, respectively. The adjusted signal components are downmixed by summer 227 and may be further adjusted by variable amplifier 281. The adjusted signal is then sent to individual listening devices 224. According to one embodiment of the present invention, the personal VRA decoder is interfaced with the individual listening device and forms one unit which is denoted as 250. Alternatively, personal VRA decoder 223 and individual listening device 224 may be separate devices and communicate in a wired or wireless manner. Individual listening device 224 may be a hearing aid having the components shown in FIG. 3. As such, the output of personal VRA decoder 223 is feed to end-user controlled amplifier 13 for further adjustment by the end-user. Although three personal VRA decoders and associated individual listening devices are shown, more personal VRA decoders and associated individual listening devices can be used without departing from the spirit and scope of the present invention.

For 5.1 channel programming, voice is primarily placed on the center channel while the remaining audio resides on left, right, left surround, and right surround. For end-users with individual listening devices, spatial positioning of the sound is of little concern since most have severe difficulty with speech intelligibility. By allowing the end-user to adjust the level of the center channel with respect to the other 4.1 channels, an improvement in speech intelligibility can be provided. These 5.1 channels are then downmixed to 2 channels, with the volume adjustment of the center channel allowing the improvement in speech intelligibility without relying on the hearing impaired mode mentioned above. This aspect of the present invention has an advantage over the fully functional AC3-type, in that an end-user can obtain limited VRA adjustment without the need of a separate dialog channel such as the hearing impaired mode.

Figure 5:
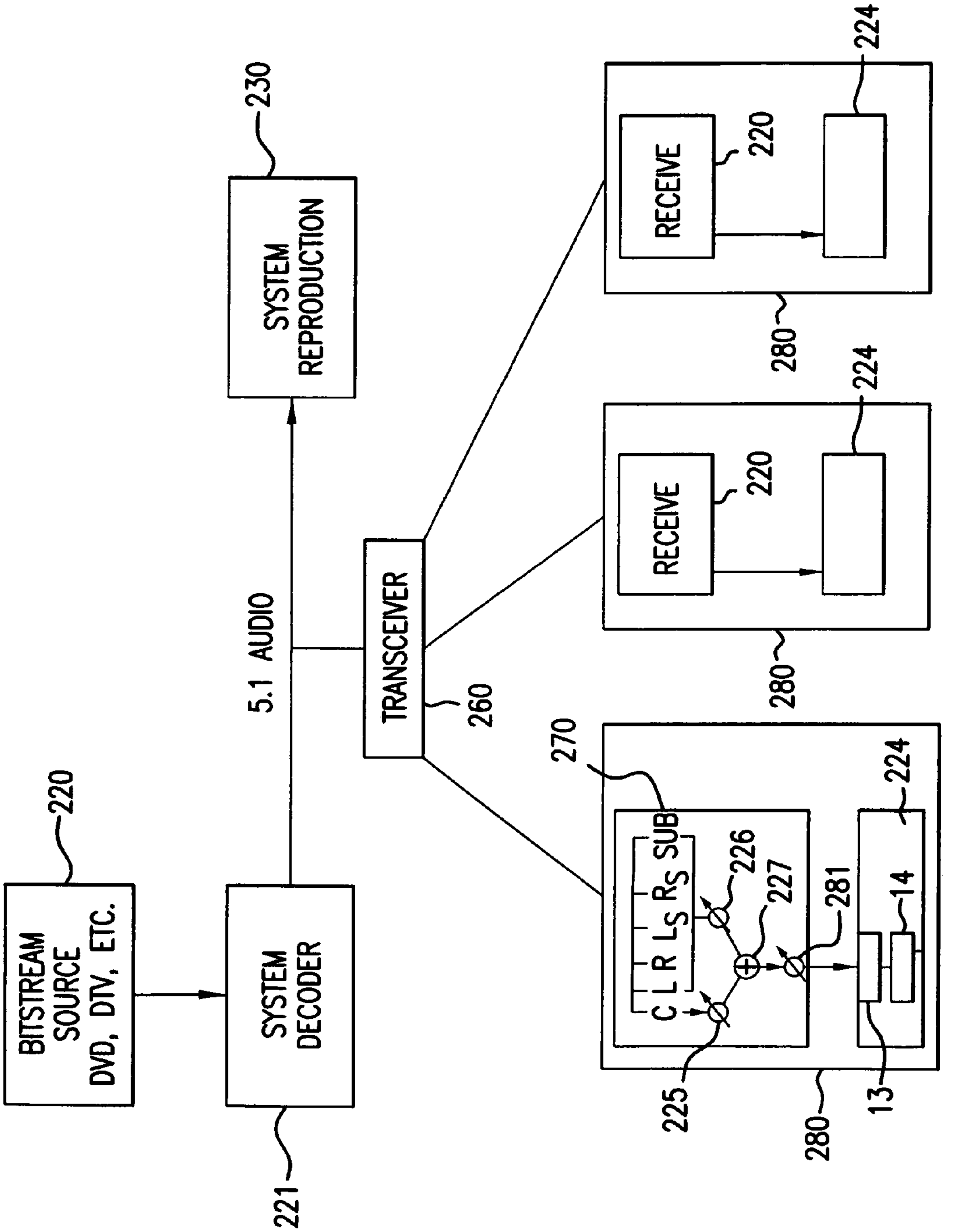
FIG. 5 is a block diagram illustrating a decoder that sends wireless transmission to individual listening devices according to an embodiment of the present invention.

FIG. 5 illustrates a decoder that sends wireless transmission directly to an individual listening device according to an embodiment of the present invention. As described above, digital bitstream source 220 provides the digital bitstream, as before, to the system decoder 221. If there is no metadata useful to the hearing impaired listener (i.e., absence of the HI mode) there is no need to transmit the entire digital bitstream, simply the audio signals. Note that this is a small deviation from the concept of having a digital decoder in the hearing aid itself, but is also meant to provide the same service to the hearing impaired individual. At system reproduction 230, the 5.1 audio channels are separated into center (containing mostly dialog—depending on production practices) and the rest containing mostly music and effects that might reduce intelligibility. The 5.1 audio signals are also feed to transceiver 260. Transceiver 260 receives and retransmits the signals to a plurality of VRA receiving devices 270. VRA receiving devices 270 include circuitry such as demodulators for removing the carrier signal of the transmitted signal. The carrier signal is a signal used to transport or "carry" the information of the output signal. The demodulated signal creates left, right, left surround, right surround, and sub (remaining audio) and center (preferred) channel signals. The preferred channel signal is adjusted using variable amplifier 225 while the remaining audio signal (the combination of the left, right, left surround, right surround and subwoofer) is adjusted using variable amplifier 226. The output from each of these variable amplifies is feed to summer 227 and the output from summer 227 may be adjusted using variable amplifier 281. This added and adjusted electrical signal is supplied to end-user controlled amplifier 13 and later sent to power amplifier 14. The amplified electrical signal is then converted into an amplified acoustical signal presented to the end-user. According to the embodiment described above, multiple end-users can simultaneously received the output signal for VRA adjustments.

Figure 6:
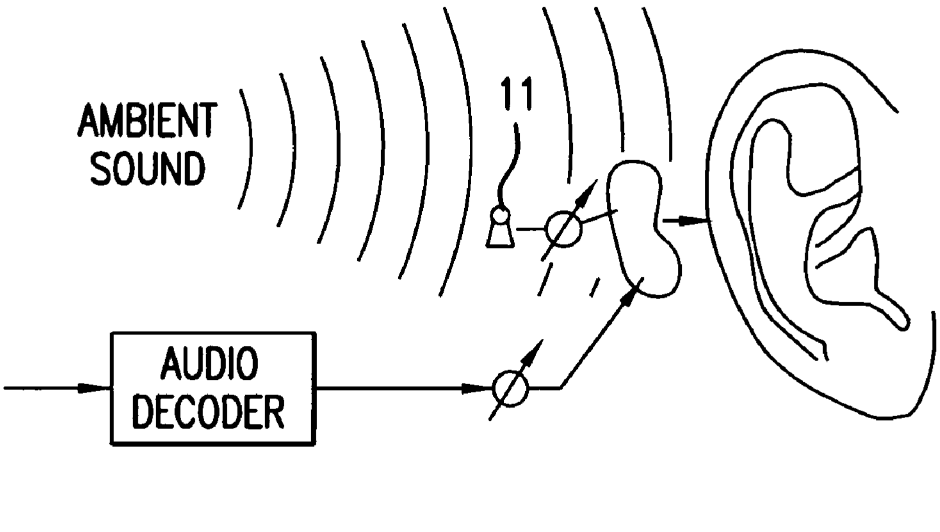
FIG. 6 is an illustration of ambient sound arriving at both the hearing aid's microphone and the end-user's ear.
Figure 7:
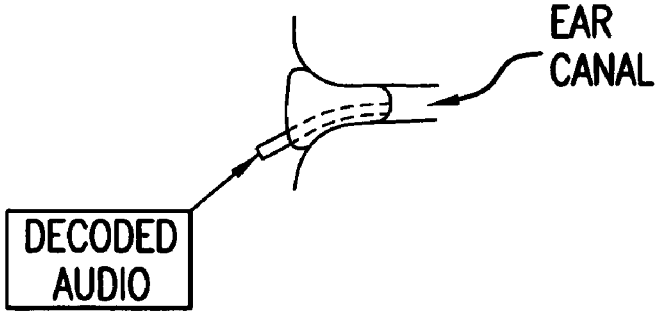
FIG. 7 is an illustration of an earplug used with the hearing aid shown in FIG. 6.

FIGS. 6–7 describe several related features used in association with the present invention. FIG. 6 illustrates ambient sound (which contains the same digital audio programming) arriving at both the hearing aid's microphone 11 and the end-user' s ear. The ambient sound received by the microphone will not be synchronized perfectly with the sound arriving via the personal VRA decoder 223 attached to the hearing aid. The reason for this is that the two transmission paths will have features that are significantly different. The personal VRA decoder provides a signal that has traveled a purely electronic path, at the speed of light, with no added acoustical features. The ambient sound, however, travels a path to the end-user from the sound source at the speed of sound and also contain reverberation artifacts defined by the acoustics of the environment where the end-user is located. If the end-user has at least some unassisted hearing capability, turning the ambient microphone of the hearing aid off, will not completely remedy the problem. The portion of the ambient sound that the end-user can hear will interfere with the programming delivered by the personal audio decoder.

One solution contemplated by the present invention is to provide the end-user with the ability to block the ambient sound while delivering the signal from the VRA personal decoder. This is accomplished by using an earplug as shown in FIG. 7.

While this method will work up to the limits of the earplug ambient noise rejection capability, it has a notable drawback. For someone to enjoy a program with another person, it will likely be necessary to easily communicate while the program is ongoing. The earplug will not only block the primary audio source (which interferes with the decoded audio entering the hearing aid), but also blocks any other ambient noise indiscriminately. In order to selectively block the ambient noise generated from the primary audio reproduction system without affecting the other (desirable) ambient sounds, more sophisticated methods are required. Note that similar comments can be made concerning the acceptability of using headset decoders. The headset earcups provide some level of attenuation of ambient noise but interfere with communication. If this is not important to a hearing impaired end-user, this approach may be acceptable.

Figure 8:
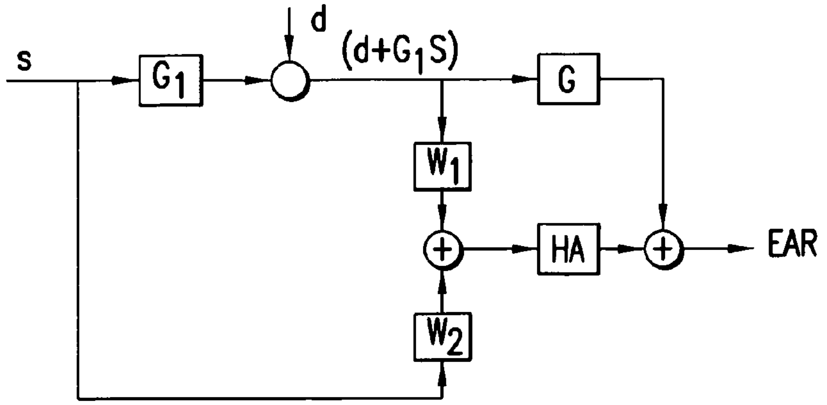
FIG. 8 is a block diagram of signal paths reaching a hearing impaired end-user through a decoder enabled hearing aid according to an embodiment of the present invention.

What is needed is a way to avoid the latency problems associated with airborne transmission of digital audio programming while allowing the hearing impaired listener to interact with other viewers in the same room. FIG. 8 shows a block diagram of the signal paths reaching the hearing impaired end-user through the digital decoder enabled hearing aid. The pure (decoded) digital audio "S" goes directly to the hearing aid "HA" and can be modified by an end-user adjustable amplifier "$w_2$". This digital audio signal also travels through the primary delivery system and room acoustics ($G_1$) before arriving at the hearing aid transducer. In addition to this signal, "d" exists and represents the desired ambient sounds such as friends talking. This total signal reaching the microphone is also end-user adjustable by the gain (possibly frequency dependent) "$w_1$". Clearly the first problem arises by realizing that the signal s modified by G, interferes with the pure digital audio signal coming from the hearing aid decoder; and the desired room audio is delivered through the same signal path. A second problem exists when the physical path through the hearing aid is included, and it is assumed that the end-user has some ability to hear audio through that path (represented by "G"). What actually arrives at the ear is a combination of the room audio amplified by $w_1$, the decoder signal amplified by $w_2$, and the room audio suppressed by "G". What is desired from the entire system is a simple end-user adjustable mix between the hearing impaired modified decoder output and the desired signal existing in the room. Since there is a separate measurement of the decoder signal being transmitted to the end-user, this end result is possible by using adaptive feedforward control.

Figure 9:
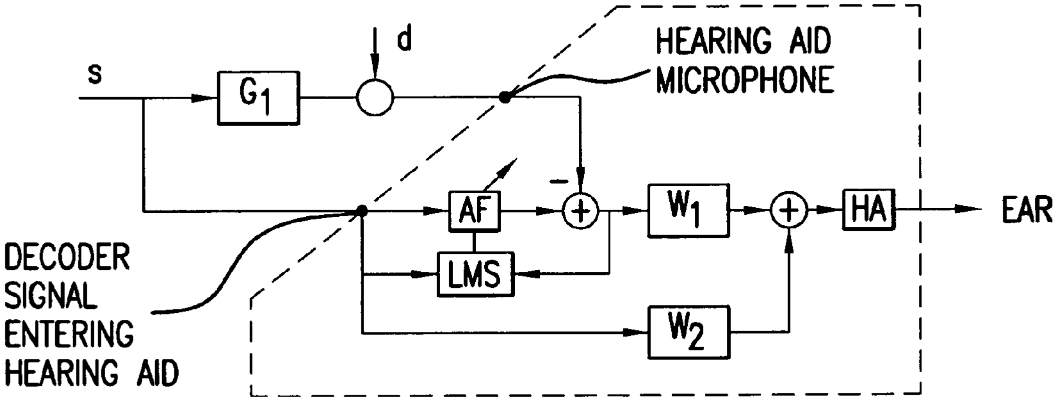
FIG. 9 is a block diagram of signal paths reaching a hearing impaired end-user incorporating an adaptive noise canceling algorithm.

FIG. 9 illustrates a reconstructed block diagram incorporating an adaptive filter (labeled "AF"). There is one important assumption that underlies the method for adaptive filtering presented in this embodiment: the transmission path through "G" in FIG. 8 is essentially negligible. In physical terms this means that the passive noise control performance of the hearing aid itself is sufficient enough to reject the ambient noise arriving at the end-user's ear. (Note also that G includes the amount of hearing impairment that the individual has; if it sufficiently high, this sound path will also be negligible). If this is not the case, measures should be taken to add additional passive control to the hearing aid itself so the physical path (not the electronic path) from the environment to the end-user's eardrum has a very high insertion loss. The dotted line in FIG. 9 represents the hearing aid itself. There are audio inputs: the hearing aid microphone picking up all ambient noise (including the audio programming from the primary playback device speakers that has not been altered by the hearing impaired modes discussed earlier) and the digital audio signal that has been decoded and adjusted for optimal listening for a hearing impaired individual. As mentioned earlier, the difficulty with the hearing aid microphone is that it picks up both the desired ambient sounds (conversation) and the latent audio program. This audio program signal will interfere with the hearing impaired audio program (decoded separately). Simply reducing the volume level of the hearing aid microphone will remove the desired audio. The solution as shown in FIG. 9 is to place an adaptive noise canceling algorithm on the microphone signal, using the decoder signal as the reference. Since adaptive filters will only attempt to cancel signals for which they have a coherent reference signal, the ambient conversation will remain unaffected. Therefore the output of the adaptive filter can be amplified separately via $w_1$, as the desired ambient signal and the decoded audio can be amplified separately via $w_2$. The inherent difficulty with this method is the bandwidth of the audio program that requires canceling may exceed the capabilities of the adaptive filter.

Figure 10:
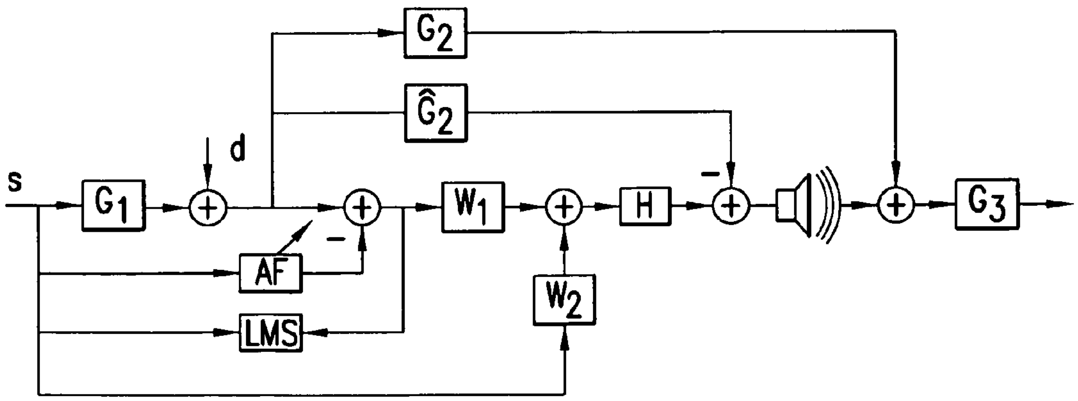
FIG. 10 is a block diagram of signal paths reaching a hearing impaired end-user through a decoder according to an alternative embodiment of the present invention.

One other possibility is available that combines adaptive feedforward control with fixed gain feedforward control. This option, illustrated in FIG. 10, is more general in that it does not require that the acoustic path through the hearing aid is negligible. This path is removed from the signal hitting the ear by taking advantage of the fact that it is possible to determine the frequency response (transmission loss) of the hearing aid itself, and to use that estimate to eliminate the contribution to the overall pressure hitting the ear. FIG. 10 illustrates a combination of the entire hearing aid plant and the control mechanism. The plant components are described first. The decoder signal "S" is sent to the hearing aid decoder (as discussed earlier) for processing of the hearing impaired or center channel for improved intelligibility (processing not shown). The same signal is also delivered to the primary listening environment and through those acoustics, all represented by $G_1$. Also in the listening environment are audio signals that are desired such as conversation, represented by the signal "d". The combination of these two signals ($G_1s+d$) is received by the hearing aid microphone at the surface of the listener's ear. This same acoustic signal travels through the physical components of the hearing aid itself, represented by $G_2$. If the hearing aid has effective passive control, this transfer function can be quite small, as assumed earlier. If not, the acoustic or vibratory transmission path can become significant. This signal enters the ear canal behind the hearing aid and finally travels through any hearing impairment that the end-user may have (represented by $G_3$) to the auditory nerve. Also traveling through the hearing aid is the electronic version of the ambient noise (amplified by $w_1$) combined with the (already adjusted) hearing impaired decoder signal (amplified by $w_2$). The end-user adjusted combination of these two signals represents the mixture between ambient noise and the pure decoder signal that has already been modified by the same end-user to provide improved intelligibility. To understand the effects of the two control mechanisms, consider that the adaptive filter (AF) and the plant estimate $G_2$ (with a hat on top) are both zero (i.e. no control is in place). The resulting output arriving at the end-users ear becomes $$G_3G_2d+G_3G_2G_1S+G_3Hw_2S+G_3Hw_1d+G_3Hw_1G_1S$$

Ideally, the hearing aid (H) will invert the hearing impairment, $G_3$. Therefore the last three terms where both $G_3$ and H appear, will have, those coefficients to be approximately one. The resulting equation is then $$w_2S+w_1d+G_3G_2d+G_3G_2G_1S+w_1G_1S$$

This does not provide the sound quality needed. While the desired and decoder signals do have level adjustment capability, the last three terms will deliver significant levels of distortion and latency both through the electrical and physical signal paths. The desired result is a combination of the pure decoder signal and the desired ambient audio signal where the end-user can control the relative mix between the two with no other signals in the output. The variables "S" and "$d+G_1S$" are available for direct measurement and the values of H, $w_1$, and $w_2$ are controllable by the end-user. This combination of variable permits the adjustment capability desired. If the adaptive filter and the plant estimate ($G_2$ hat) are now included in the equation for the output to the end end-user's nerve, it becomes:

$$w_1d+w_2G_1S+w_{AFS}+G_3G_2(d+G_1S)-G_3(G_2hat)(d+G_1S)$$

Now, if the adaptive filter converges to the optimal solution, it will be identical to $G_1$ so that the third and fourth terms in the above equation cancel. And if the estimate of $G_2$ approaches $G_2$ due to a good system identification, the last two terms in the previous equation will also cancel. This leaves only the decoder signal "S" end-user modified by $w_2$ and the desired ambient sound "d" end-user modified by $w_1$, the desired result. The limits of the performance of this method depend on the performance of the adaptive filter and on the accuracy of the system identification from the outside of the hearing aid to the inside of the hearing aid while the end-user has it comfortably in position. The system identification procedure itself can be carried out in a number of ways, including a least mean squares fit.

Interception Box

Figure 11:
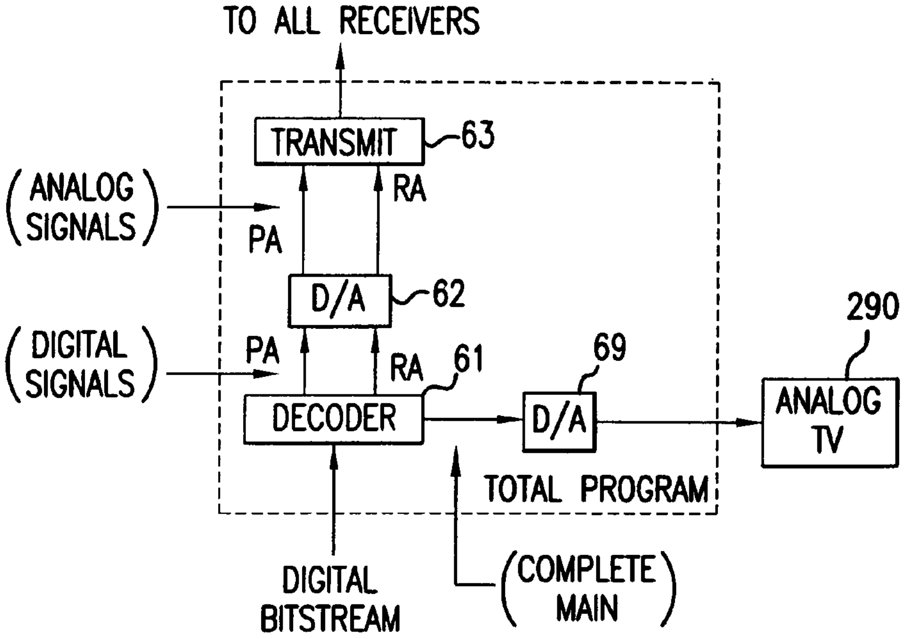
FIG. 11 illustrates another embodiment of the present invention.

FIG. 11 illustrates another embodiment according to the present invention. FIG. 11 shows the features of a VRA set top terminal used for simultaneously transmitting a VRA adjustable signal to multiple end-users.

VRA set top terminal 60 includes a decoder 61 for decoding a digital bitstream supplied by a digital source such as a digital TV, DVD, etc. Decoder 61 decodes the digital bitstream and outputs digital signals which have a preferred audio component (PA) and a remaining audio portion (RA). The digital signals are feed into a digital-to-analog (D/A) converters 62 and 69 which converts the digital signals into analog signals. The analog signals from D/A converter 62 are feed to transmitter 63 to be transmitted to receivers such as receivers 270 shown in FIG. 5. Thus, multiple end-users with individual listening devices can adjust the voice-to-remaining audio for each of their individual devices. The output from D/A converter 69 is sent to a playback device such as analog television 290.

Figure 12:
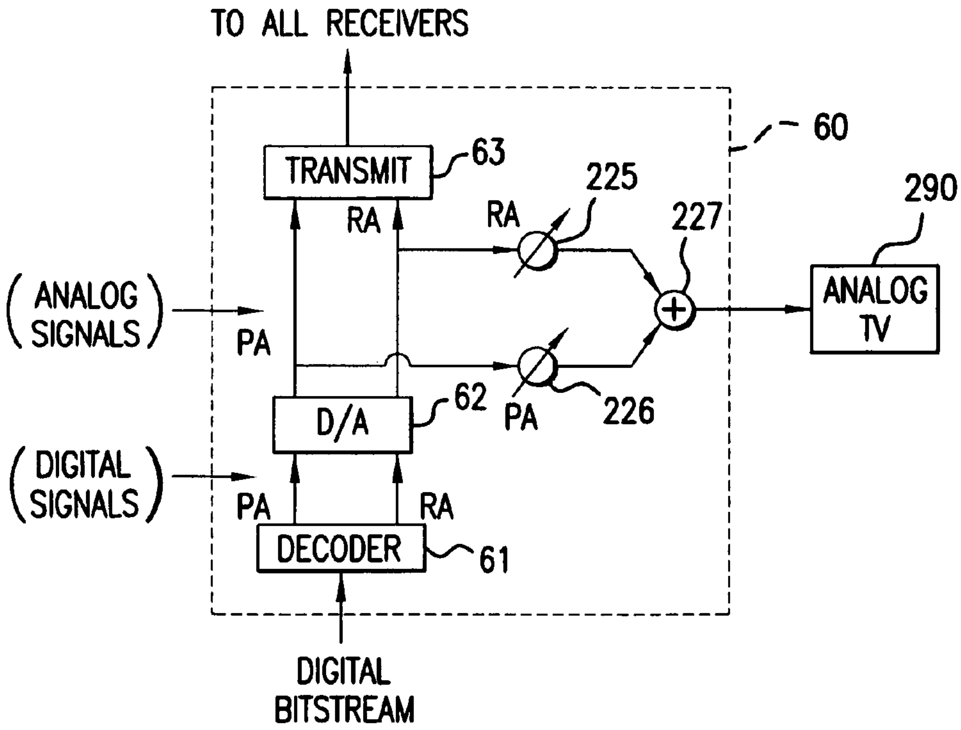
FIG. 12 illustrates an alternative embodiment of the present invention.

FIG. 12 illustrates an alternative embodiment of the present invention. Like in FIG. 11, a bitstream is received by decoder 61 of VRA set-top-terminal 60. Decoder outputs digital signals which are sent to D/A converter 62. The output of D/A converter 62 are analog signals sent to transmitter 63 for transmission of these signals to receivers 270. D/A converter 62 also feeds its output analog signals to variable amplifiers 225 and 226 for end-user adjustments before being downmixed by summer 227. This output signal is feed to analog television 290 in a similar manner as discussed above with respect to FIG. 11 but already having been VRA adjusted. According to this embodiment of the present invention, not only will hearing impaired end-users employing receivers 270 enjoy VRA adjustment capability, but end-users listening to analog television will have the same capability.

While many changes and modifications can be made to the invention within the scope of the appended claims, such changes and modifications are within the scope of the claims and covered thereby.

What is claimed is:

1. A set-top-terminal for providing voice-to-remaining audio capability comprising:

a decoder for decoding a bitstream and producing as its output, a digital preferred audio signal and a digital remaining audio signal;

a digital to analog (D/A) converter coupled to said decoder, said D/A converter converting said digital preferred audio signal and a digital remaining audio signal into an analog preferred audio signal and an analog remaining audio signal;

a transmitter coupled to said D/A converter and transmitting said analog preferred audio signal and said analog remaining audio signal;

a first end-user adjustable amplifier coupled to said analog preferred voice signal and amplifying said analog preferred voice signal;

a second end-user adjustable amplifier coupled to said analog remaining audio signal and amplifying said analog remaining audio signal; and a summer coupled to outputs of said first and second end-user adjustable amplifiers and outputting a total audio signal.

2. The set-top-terminal of claim 1, wherein an output of the summer outputting said total signal is coupled to an analog receiving device.

* * * * *